(12) United States Patent
Yano

(10) Patent No.: US 8,277,295 B2
(45) Date of Patent: Oct. 2, 2012

(54) VENTILATION MEMBER AND VENTILATION STRUCTURE

(75) Inventor: Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1016 days.

(21) Appl. No.: 12/224,480

(22) PCT Filed: Feb. 15, 2007

(86) PCT No.: PCT/JP2007/052769
§ 371 (c)(1),
(2), (4) Date: Aug. 27, 2008

(87) PCT Pub. No.: WO2007/099782
PCT Pub. Date: Sep. 7, 2007

(65) Prior Publication Data
US 2009/0109618 A1 Apr. 30, 2009

(30) Foreign Application Priority Data

Mar. 2, 2006 (JP) .................................. 2006-056684

(51) Int. Cl.
*F24F 7/00* (2006.01)
*H05K 7/20* (2006.01)
*B01D 50/00* (2006.01)
*E04H 7/00* (2006.01)
(52) U.S. Cl. .......... 454/270; 361/694; 55/385.4; 52/195
(58) Field of Classification Search .................. 454/184, 454/143, 270; 361/694; 55/385.4; 52/195
See application file for complete search history.

(56) References Cited

U.S. PATENT DOCUMENTS

| | | | | | |
|---|---|---|---|---|---|
| 1,626,129 | A | * | 4/1927 | Herbert | ............................. 49/143 |
| 5,209,992 | A | * | 5/1993 | Feres | ............................... 429/86 |
| 5,914,415 | A | * | 6/1999 | Tago | ............................. 55/385.4 |
| 6,364,924 | B1 | * | 4/2002 | Mashiko et al. | ............. 55/385.4 |
| 7,066,337 | B2 | * | 6/2006 | Hsu | ................................ 210/452 |
| 2003/0216119 | A1 | | 11/2003 | Mashiko et al. | |
| 2008/0041624 | A1 | | 2/2008 | Sasaki et al. | |

FOREIGN PATENT DOCUMENTS

| | | |
|---|---|---|
| DE | 202005014946 U1 | 1/2006 |
| JP | 10-085536 A | 4/1998 |
| JP | 2001-143524 A | 5/2001 |
| JP | 2002-013952 A | 1/2002 |
| JP | 2003-318557 A | 11/2003 |
| JP | 2003-336874 A | 11/2003 |
| JP | 2006-041304 A | 2/2006 |

* cited by examiner

*Primary Examiner* — Steven B McAllister
*Assistant Examiner* — Helena Kosanovic
(74) *Attorney, Agent, or Firm* — Hamre, Schumann, Mueller & Larson, P.C.

(57) ABSTRACT

A ventilation member (1) comprises a support body (2), a ventilation membrane (10), and a cover part (3). The support body (2) includes a bottom surface portion (4) connected to the casing (50) and a side surface portion (5) on which the ventilation membrane (10) is installed. A first opening (4h) is formed in the bottom surface portion (4), and a second opening (5h) is formed in the side surface portion (5). The ventilation membrane (10) is installed on the side surface portion (5) so as to close the second opening (5h). The cover part (3) has a cylindrical side wall part (3b) that circumferentially surrounds the support body (2) in such a state that the support body (2) is assembled therein. The position of the second opening (5h) to be formed in the side surface portion (5) of the support body (2) is adjusted so that the ventilation membrane (10) is protected when the membrane faces the cylindrical side wall part (3b).

18 Claims, 12 Drawing Sheets

VENTILATION MEMBER AND VENTILATION STRUCTURE

TECHNICAL FIELD

The present invention relates to a ventilation member to be attached to a casing. The invention also relates to a ventilation structure using the ventilation member.

BACKGROUND ART

A ventilation member is installed on a casing that accommodates electric components for an automobile, such as lamps, motors, sensors, and an ECU. Such a ventilation member has the function of ensuring ventilation between the interior and the exterior of the casing, the function of easing a change in pressure inside the casing caused by a temperature change, and the function of inhibiting the entrance of foreign matter into the casing. Examples of such a ventilation member are disclosed in JP-A-2001-143524 and JP-A-10-85536.

For example, a ventilation member 60 disclosed in JP-A-2001-143524 is formed of a cover part 61 in the shape of a bottomed cylinder, a cylindrical body 62 made of rubber, and a ventilation membrane 63 as are shown in FIG. 12A and FIG. 12B. The cylindrical body 62 has a diameter slightly smaller than that of the cover part 61, and the ventilation membrane 63 is disposed so as to close one of the openings of the cylindrical body 62. By fitting in the cylindrical body 62 inside the cover part 61 from the ventilation membrane 63 side, ventilation channels are defined between the inner peripheral surface of the cover part 61 and the outer peripheral surface of the cylindrical body 62 and between the bottom surface of the cover part 61 and the ventilation membrane 63. By inserting a cylindrical opening part 50a formed in the casing 50 into the cylindrical body 62, the ventilation member 60 as described above can be installed on the casing 50.

DISCLOSURE OF THE INVENTION

There has been a need for a ventilation member that is compact yet achieves sufficient permeability and excels in against exposure to foreign matter, such as water droplets and dust. The opening area in the cylindrical body may be enlarged to enhance the permeability of the ventilation members disclosed in JP-A-2001-143524 and JP-A-10-85536. However, as can be readily understood from FIG. 12A and FIG. 12B, enlarging the opening area in the cylindrical body can undesirably increase the overall size of the ventilation member.

An object of the invention is therefore to provide a ventilation member that is compact yet achieves sufficient permeability and excels in against exposure to foreign matter, such as water droplets and dust. Another object of the invention is to provide a ventilation structure using this ventilation member.

More specifically, one aspect of the invention provides a ventilation member to be installed on a casing that needs ventilation. The ventilation member includes: a support body provided with a space in an interior thereof, the space serving as a ventilation channel between an interior and an exterior of the casing, the support body having a bottom surface portion in which a first opening is formed and a side surface portion in which a second opening is formed, the first and second openings bringing the space into communication with the exterior, and the support body being configured in such a manner that the bottom surface portion in which the first opening is formed serves as a connection portion to be connected to the casing; a ventilation membrane installed on the side surface portion of the support body so as to close the second opening; and a cover part inside of which the support body is fit in from a side opposite to the bottom surface portion. Assuming a direction in which the support body is to be fit in inside the cover part to be an axial direction, then in an assembled state where the support body is fit in inside the cover part, the cover part has a cylindrical side wall portion that surrounds the support body in a circumferential direction and a ceiling portion that continues to one end side of the cylindrical side wall portion and covers the support body from the side opposite to the bottom surface portion. A length of the cylindrical side wall portion with respect to the axial direction is adjusted so that the ventilation membrane is protected in such a state where the membrane faces the cylindrical side wall portion, and a first clearance that functions as the ventilation channel is defined between the ceiling portion of the cover part and the support body and a second clearance that communicates with the first clearance is defined between the cylindrical side wall portion of the cover part and the ventilation membrane in such a manner that the second clearance communicates with the exterior from a side opposite to the side where the ceiling portion of the cover part is positioned.

The ventilation member of the invention as described above is configured in such a manner that the ventilation membrane is disposed to the side surface portion of the support body in a positional relationship in which the ventilation membrane faces the cylindrical side wall portion of the cover part. When configured in this manner, it is possible to increase the opening area of the second opening to be covered with the ventilation membrane, that is, the ventilation area, without having to increase the dimension of the support body significantly. Also, even in a case where foreign matter, such as water droplets, enters into the cover part, it is relatively difficult for the foreign matter to remain on the cylindrical side wall portion of the cover part. Accordingly, by adopting an arrangement that allows the cylindrical side wall portion of the cover part and the ventilation membrane to face each other, it is possible to reduce the possibility of adhesion of foreign matter onto the ventilation membrane. As has been described, the ventilation member of the invention is compact yet achieves high permeability and excels in against exposure to foreign matter, such as water droplets and dust.

BEST MODE FOR CARRYING OUT THE INVENTION

First Embodiment

Hereinafter, embodiments of the invention will be described with reference to the accompanying drawings.

Figure 1:
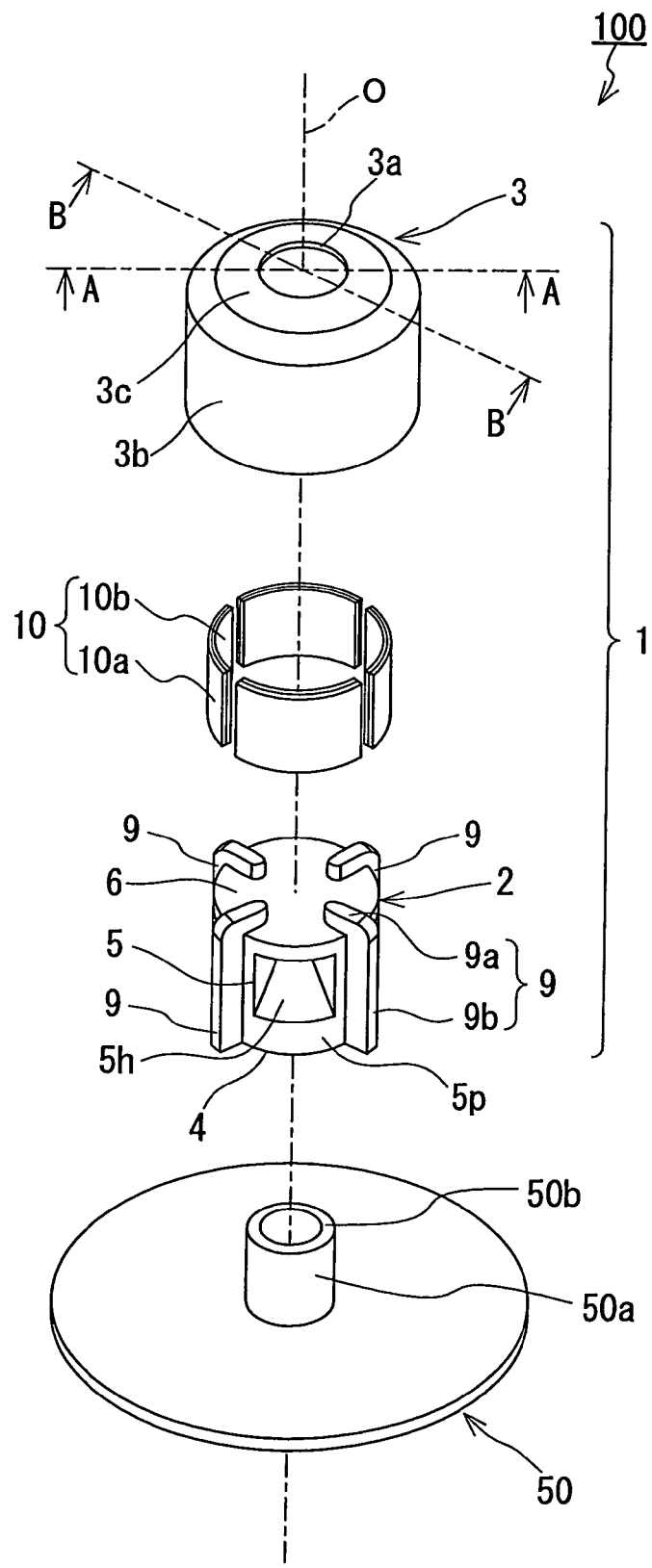
FIG. 1 is an exploded perspective view of a ventilation member according to a first embodiment of the invention.
Figure 2:
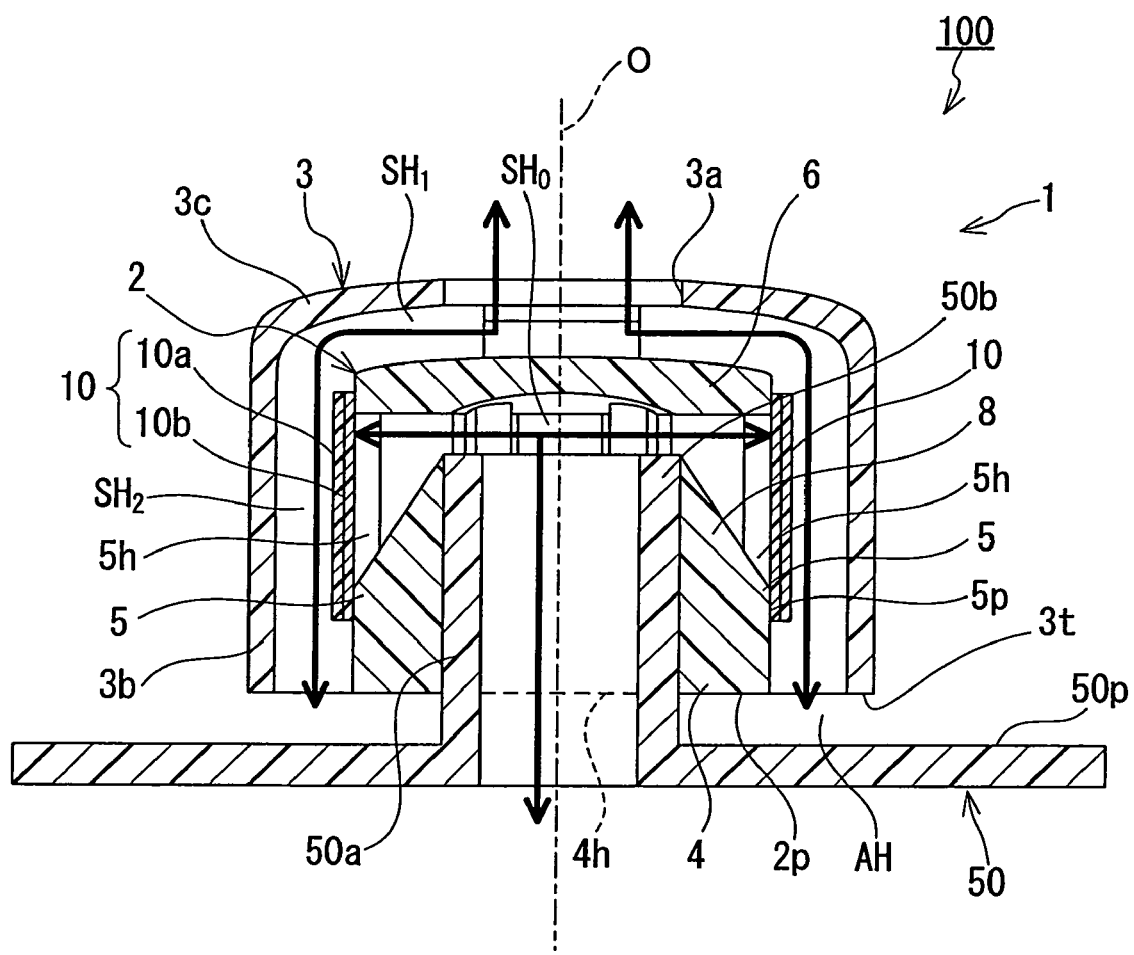
FIG. 2 is a cross section taken on line A-A showing the ventilation member shown in FIG. 1 in an assembled state.
Figure 3:
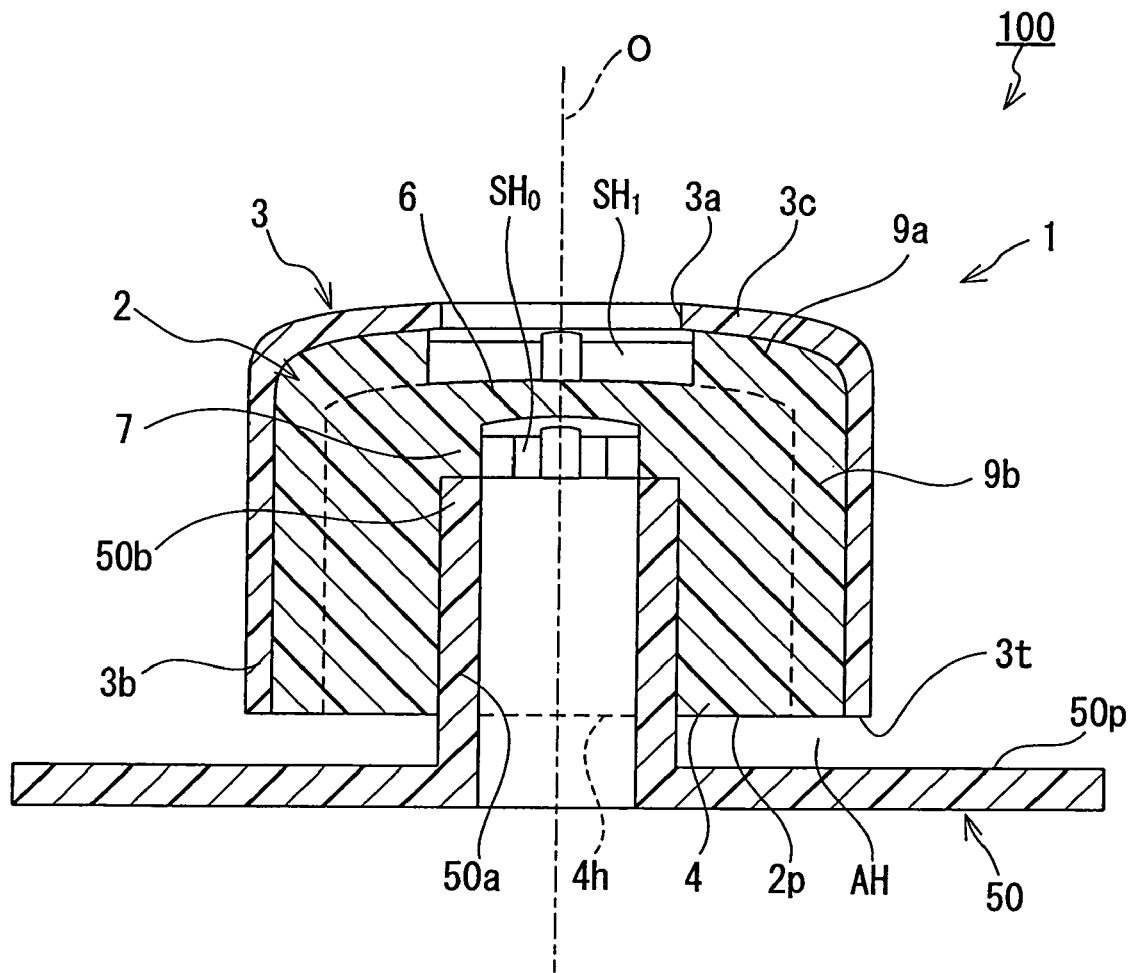
FIG. 3 is a cross section taken on line B-B showing the ventilation member shown in FIG. 1 in the assembled state.

FIG. 1 is an exploded perspective view of a ventilation member and a ventilation structure of the invention. FIG. 2 is a view showing a state where the ventilation member is installed on a casing, that is, a cross section of the ventilation structure taken on line A-A. FIG. 3 is another cross section taken on line B-B. In FIG. 2, an air circulation channel is indicated by thick arrows (the same applies to FIG. 6 and FIG. 10).

The ventilation member 1 is installed on an opening part 50a of a casing 50, for example, of an electrical component for automobile, and thereby forms a ventilation structure 100 to enable ventilation between the interior and the exterior of the casing 50. The opening part 50a of the casing 50 is of a configuration in the shape of a nozzle that is convex toward the exterior of the casing 50. The ventilation member 1 is fixed to the casing 50 by inserting the nozzle-shaped opening part 50a into the ventilation member 1.

As is shown in FIG. 1, the ventilation member 1 includes a support body 2, ventilation membranes 10, and a cover part 3. Regarding the support body 2, the main body portion except for ribs 9 has a configuration almost in the shape of a column (cylindrical column in this embodiment) overall. The cover part 3 has a configuration in the shape of a cylindrical shape large enough to accommodate therein the support body 2 in the shape of a cylindrical column. The support body 2 and the cover part 3 are disposed coaxially about an axial line O. The fit-in direction in which the support body 2 is to be fit in inside the cover part 3 is a direction parallel to the axial line O. Hereinafter, this direction will be called the axial direction. Also, the side on which a ceiling portion 3c of the cover part 3 is positioned and the opposite side respectively will be called the upper side and the lower side with respect to the axial direction.

As is shown in FIG. 1, the cover part 3 is formed of the ceiling portion 3c and a cylindrical side wall portion 3b. The cylindrical side wall portion 3b has an almost constant diameter. In an assembled state where the support body 2 is fit in inside the cover part 3, it surrounds the support body 2 and the ventilation membranes 10 in the circumferential direction and thereby protects the ventilation membranes 10 from foreign matter, such as water droplets and dust. The ceiling portion 3c is a portion that continues to one end side of the cylindrical side wall portion 3b and covers the support body 2 from the upper side with respect to the axial direction.

As are shown in FIG. 1 and FIG. 2, the support body 2 has a hollow configuration provided with a space $SH_0$ that serves as a ventilation channel between the interior and the exterior of the casing 50 in the interior thereof. It includes a bottom surface portion 4 in which a first opening 4h is formed that brings the space $SH_0$ in the interior in communication with the exterior, a side surface portion 5 in which second openings 5h are formed that also bring the space $SH_0$ in communication with the exterior, a top portion 6 positioned on the side opposite to the bottom surface portion 4, and the ribs 9 extending along the side surface portion 5 from top to bottom with respect to the axial direction. The bottom surface portion 4 plays a role as a connection portion to be connected to the opening part 50a of the casing 50. The ribs 9 are provided at plural points at equiangular intervals along the circumferential direction of the support body 2. The second openings 5h are formed between the adjacent ribs 9 and 9 and the ribs 9 and the second openings 5h are aligned side by side alternately in the circumferential direction. The ventilation membranes 10 are installed on the side surface portion 5 so as to close the individual second openings 5h. The internal pressure and the external pressure of the casing 50 are maintained equal owing to a gas permeation action of the ventilation membranes 10 installed on the side surface portion 5.

As are shown in FIG. 2 and FIG. 3, regarding the cylindrical side wall portion 3b of the cover part 3, the length with respect to the axial direction is adjusted so that it protects the ventilation membranes 10 installed on the side surface portion 5 of the support body 2 in a state where the both face each other. To be more specific, the lower end 3t of the cylindrical side wall portion 3b is positioned below the lower ends of the ventilation membranes 10. In addition, owing to the ribs 9 that play a role of spacers, a first clearance $SH_1$ to function as a ventilation channel is defined between the ceiling portion 3c of the cover part 3 and the support body 2. Likewise, second clearances $SH_2$ communicating with the first clearance $SH_1$ are defined between the cylindrical side wall portion 3b of the cover part 3 and the ventilation membranes 10. Further, a clearance AH is defined between the lower end 3t of the cylindrical side wall portion 3b of the cover part 3 and the surface 50p of the casing 50. A ventilation channel formed of the first clearance $SH_1$ and the second clearances $SH_2$ communicates with the clearance AH. Because the ventilation membranes 10 are disposed on the side surface portion 5 of the support body 2, it is possible to increase the opening area of the second openings 5h, that is, the ventilation area, without having to increase the dimension of the support body 2 significantly.

It is possible to make one of the support body 2 and the cover part 3 from elastomer and the other from resin or metal having no rubber elasticity. It is preferable to make the support body 2 from elastomer and the cover part 3 from hard resin. The support body 2 and the cover part 3 can be fixed to each other with an elastic restoring force of the support body 2.

To be more specific, the support body 2 can be made of thermoplastic elastomer. Examples of suitable thermosetting elastomer include but are not limited to thermoplastic elastomers based on polystyrene, polyolefin, polyvinyl chloride, polyester, polyurethane, polyamide, and fluorine. All of these thermoplastic elastomers are excellent in heat resistance, weather resistance, and chemical resistance.

In addition, it is preferable for the thermoplastic elastomer forming the support body 2 to have compression set of 70% or below (preferably, 50% or below) when allowed to stand under the condition of 70° C. for 22 hours (according to JIS K6301) and a hardness of 100 or below (preferably, 80 or below) when measured by an A-type spring hardness tester. When the compression is set too high, oscillations or a temperature change readily gives rise to a clearance between the opening part 50a of the casing 50 and the support body 2. Also, when the hardness is too high, it becomes difficult to install the support body 2 on the casing 50. By setting the hardness of the support body 2 within the range specified above, a sufficient tightening force acts on the opening part 50a when the opening part 50a of the casing 50 is inserted therein. It thus becomes possible to fix the ventilation member 1 to the casing 50 firmly over a long period.

Meanwhile, the cover part 3 can be manufactured by typical molding, such as injection molding, compression molding, and cutting. It is preferable to use thermoplastic resin as a material thereof in terms of ease of molding and strength. To be more specific, thermoplastic resins, such as PBT (polybutylene terephthalate), PA (nylon), and PET (polyethylene terephthalate), are available. In addition, materials of the cover part 3 may contain pigments, such as carbon black and titanium white, reinforcing fillers, such as glass particles and glass fibers, water repellent materials, and so forth. Further, by applying a liquid repellent treatment on the surface of the cover part 3, it becomes easier to remove liquid (water and oil). Other treatments and processing, such as an easy-adhesion treatment, an electric insulating treatment, semiconductor processing, and a conducting treatment, also may be applied to the cover part 3.

The structure and materials of the ventilation membranes 10 are not particularly limited as long as they are membranes that allow permeation of a gas and inhibit permeation of liquid. For example, the ventilation membranes 10 each formed by laminating a reinforcing layer 10b on a resin porous membrane 10a can be adopted suitably. By providing the reinforcing layer 10b, it is possible to form the ventilation membranes 10 with high strength. As materials of the resin porous membranes 10a, it is possible to use a fluorocarbon resin porous body and a polyolefin porous body that can be manufactured by known drawing or extraction. Examples of the fluorocarbon resin include but are not limited to PTFE (polytetrafluoroethylene), polychlorotrifluoroethylene, a copolymer of tetrafluoroethylene and hexafluoropropylene, and a copolymer of tetrafluoroethylene and ethylene. Examples of monomers forming polyolefin include but are not limited to ethylene, propylene, and 4-methylpentene-1,1 butene. It is possible to use a polyolefin obtained by letting these monomers undergo sole polymerization or copolymerization. Alternatively, it is also possible to use a nanofiber film porous body using polyacrylonitrile, nylon, or polylactic acid. Among all, the most preferable is a PTFE porous body that is capable of ensuring permeability with a small area and furnished with a high function of inhibiting entry of foreign matter into the casing 50.

Also, the liquid repellent treatment may be applied to the resin porous membrane 10a forming the ventilation membranes 10 to suit the application of the casing 50. The liquid repellent treatment can be performed by applying a substance having small surface tension on the resin porous membrane 10a followed by drying and then curing. It is sufficient for a liquid repellent agent used for the liquid repellent treatment to have a capability of forming a membrane having surface tension lower than that of the resin porous membrane 10a. For example, a liquid repellent agent containing polymers having perfluoroalkyl groups is suitable. The liquid repellent agent can be applied by means of impregnation, spraying, and so forth. In terms of ensuring a sufficient waterproof property, it is preferable that the average pore diameter of the resin porous membrane 10a is in a range of 0.01 μm to 10 μm, both inclusive.

As materials of the reinforcing layer 10b forming the ventilation membranes 10, those having better permeability than the resin porous membrane 10a are preferable. To be more specific, woven fabric, non-woven fabric, mesh, net, sponge, foam, a porous body, and so forth made of resin or metal are available. The resin porous membrane 10a and the reinforcing layer 10b can be laminated to each other by adhesive laminate, heat laminate, heat welding, ultrasonic welding, or with the use of an adhesive.

In addition, by taking the strength and the ease of fixing to the support body 2 into account, it is recommended to adjust the thickness of the ventilation membranes 10, for example, in a range of 1 μm to 5 mm. The permeability of the ventilation membranes 10 in Gurley value is preferably 0.1 to 300 sec/100 cm$^3$. In this embodiment, the ventilation membranes 10 are fixed to the support body 2 by heat welding. However, the ventilation membranes 10 may be fixed to the support body 2 by other methods, such as ultrasonic welding or with the use of an adhesive.

The casing 50 can be manufactured by molding as with the cover part 3. Examples of materials of the casing 50 include resin and metal, and resin is preferable in terms of electric insulation and lightness. Thermoplastic resin same as the cover part 3 is a good example of available kinds of resin. Among all, PBT is most preferable in terms of heat resistance and strength.

Hereinafter, the ventilation member 1 of this embodiment will be described more in detail.

As is shown in FIG. 2, in the support body 2, the first opening 4h is formed at one point in the bottom surface portion 4 positioned at one end side with respect to the axial direction. On the contrary, the second openings 5h are formed at four points (plural points) at equiangular intervals along the circumferential direction in the side surface portion 5 positioned in a segment from the bottom surface portion 4 to the top portion 6. A plurality of the ventilation membranes 10 are installed on the side surface portion 5 so as to close these four second openings 5h individually. The space $SH_0$ in the interior of the support body 2 communicates with the first opening 4h and all the second openings 5h.

Figure 12A:
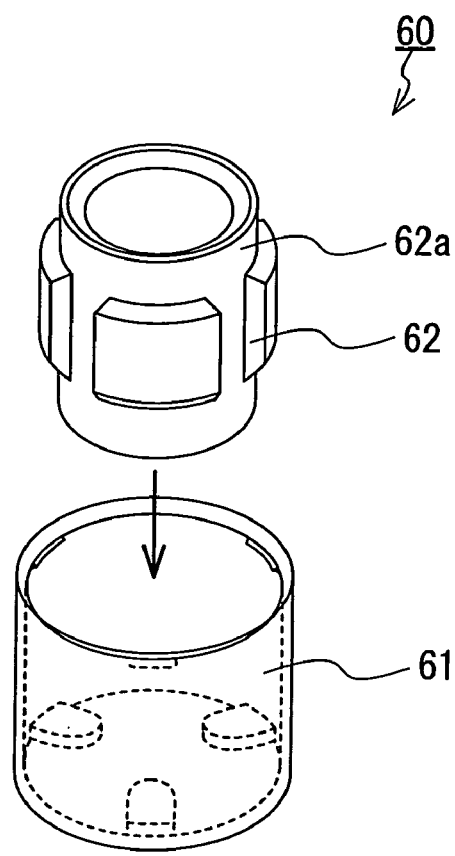
FIG. 12A is an exploded perspective view of a conventional ventilation member.
Figure 12B:
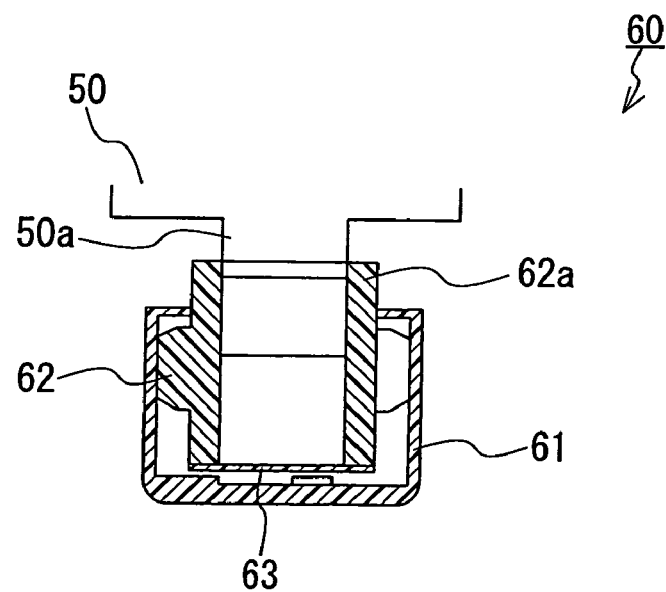
FIG. 12B is a cross section of the ventilation member shown in FIG. 12A.

In the case of the conventional ventilation member as is shown in FIG. 12B that adopts the arrangement where the normal direction to the ventilation membrane and the axial direction of the ventilation member coincide, enlargement of the ventilation area directly increases the dimension of the support body. However, by forming a plurality of the second openings 5h to be closed by the ventilation membranes 10 in the side surface portion 5 along the circumferential direction thereof, it is possible to increase the ventilation area easily without having a substantial increase in the dimension of the support body 2. Additionally, there can be expected an effect that even when foreign matter, such as water droplets, adheres to any one of the ventilation membranes 10, the permeability can be ensured by the rest of the ventilation membranes 10.

Also, as is shown in the perspective view of FIG. 1, the opening peripheral surface 5p of the side surface portion 5 onto which the membranes 10 are disposed is a curved surface that conforms to the contour of the support body 2 in the shape of a cylindrical column. When configured in this manner, it is possible to maintain a spacing between the cover part 3 and the ventilation membranes 10, that is, the width of the second clearances $SH_2$, constant all along the periphery of the support body 2. By configuring in such a manner so as to maintain the width of the second clearances $SH_2$ constant, ventilation resistance inside the cover part 3 becomes homogeneous, which can in turn prevent the occurrence of irregular circulation of air resulting from inhomogeneous ventilation resistance. In addition, because the ventilation membranes 10 are fixed in a curved shape that is convex outward in the radial direction about the axial line O, there is an effect that when foreign matter, such as water droplets, adheres onto the ventilation membranes 10, the foreign matter can be removed smoothly from the surfaces of the ventilation membranes 10.

Also, as can be understood from FIG. 1, when the ventilation member 1 is observed from a horizontal direction, which is perpendicular to the axial direction, the second openings 5h formed in the side surface portion 5 show a rectangular shape. The ventilation membranes 10 to be fixed to the side surface portion 5 are also of a similar rectangular shape. In comparison with ventilation membranes of a circular shape, the ventilation membranes 10 of a rectangular shape can be fixed to the curved opening peripheral surface 5p easily in a reliable manner.

Further, the second openings 5h are formed in the side surface portion 5 of the support body 2 in such a manner that the thickness direction of the ventilation membranes 10 becomes almost perpendicular to the axial direction. More specifically, as is shown in FIG. 2, in a cross section including the axial line O, the ventilation membranes 10 appear to be parallel to the axial direction. By fixing the ventilation membranes 10 to the support body 2 in this posture, it is possible to reduce sufficiently the possibility that the foreign matter, such as water droplets, resides on the ventilation membranes 10.

Meanwhile, a ventilation hole 3a facing the top portion 6 of the support body 2 is formed at the center in the ceiling portion 3c of the cover part 3. The ventilation hole 3a is of an almost circular shape and the center thereof coincides with the axial line O. The first clearance $SH_1$ between the ceiling portion 3c of the cover part 3 and the top portion 6 of the support body 2 and the second clearances $SH_2$ between the cylindrical side wall portion 3b of the cover part 3 and the ventilation membranes 10 communicate with the exterior of the cover part 3 also through the ventilation hole 3a. With the ventilation hole 3a as above, even in a case where the ventilation member 1 is used in an orientation in which the ceiling portion 3c of the cover part 3 is positioned on the lower side in the vertical direction and foreign matter, such as water droplets, comes into the cover part 3, it is possible to discharge the foreign matter from the ventilation hole 3a. In short, by preliminarily forming the ventilation hole 3a in the cover part 3, the ventilation member 1 can achieve an excellent dust-proof and water-proof effect regardless of the orientation in which it is used.

In addition, as is shown in FIG. 2, the cylindrical side wall portion 3b of the cover part 3 extends up to the position at which the lower end 3t becomes flush with the lower surface 2p (corresponding to the opening peripheral surface of the bottom surface portion 4) of the support body 2 with respect to the axial direction. The sufficiently wide clearance AH thus is defined between the lower end 3t of the cylindrical side wall portion 3b and the casing 50. When arranged in this manner, it is possible to protect the ventilation membranes 10 entirely from foreign matter arriving from a direction perpendicular to the axial direction in a reliable manner. In addition, by bringing the lower end of the support body 2 flush with the lower end of the cover part 3 as in this embodiment, it is advantageous to a design that minimizes an amount of protrusion of the ventilation member 1 from the surface of the casing 50.

Also, as is shown in FIG. 2, the top portion 6 of the support body 2 facing the ventilation hole 3a of the cover part 3 has a dome shape that is curved convexly toward the ventilation hole 3a. The top portion 6 of the support body 2 has no opening that communicates with the space $SH_0$ in the interior of the support body 2. Accordingly, in a case where foreign matter, such as water droplets, enters into the cover part 3 through the ventilation hole 3a, the foreign matter slides down on the top portion 6 of a dome shape and is discharged efficiently from the opposite side via the second clearances $SH_2$. Further, as is shown in a projection view of FIG. 4, the entire ventilation hole 3a fits within the outer periphery of the top portion 6. By having the positional relationship between the ventilation hole 3a and the top portion 6 as specified above, foreign matter entering into the cover part 3 through the ventilation hole 3a invariably hits on the top portion 6 of the support body 2. It is thus possible to prevent the ventilation membranes 10 from receiving direct impact from the foreign matter.

Figure 4:
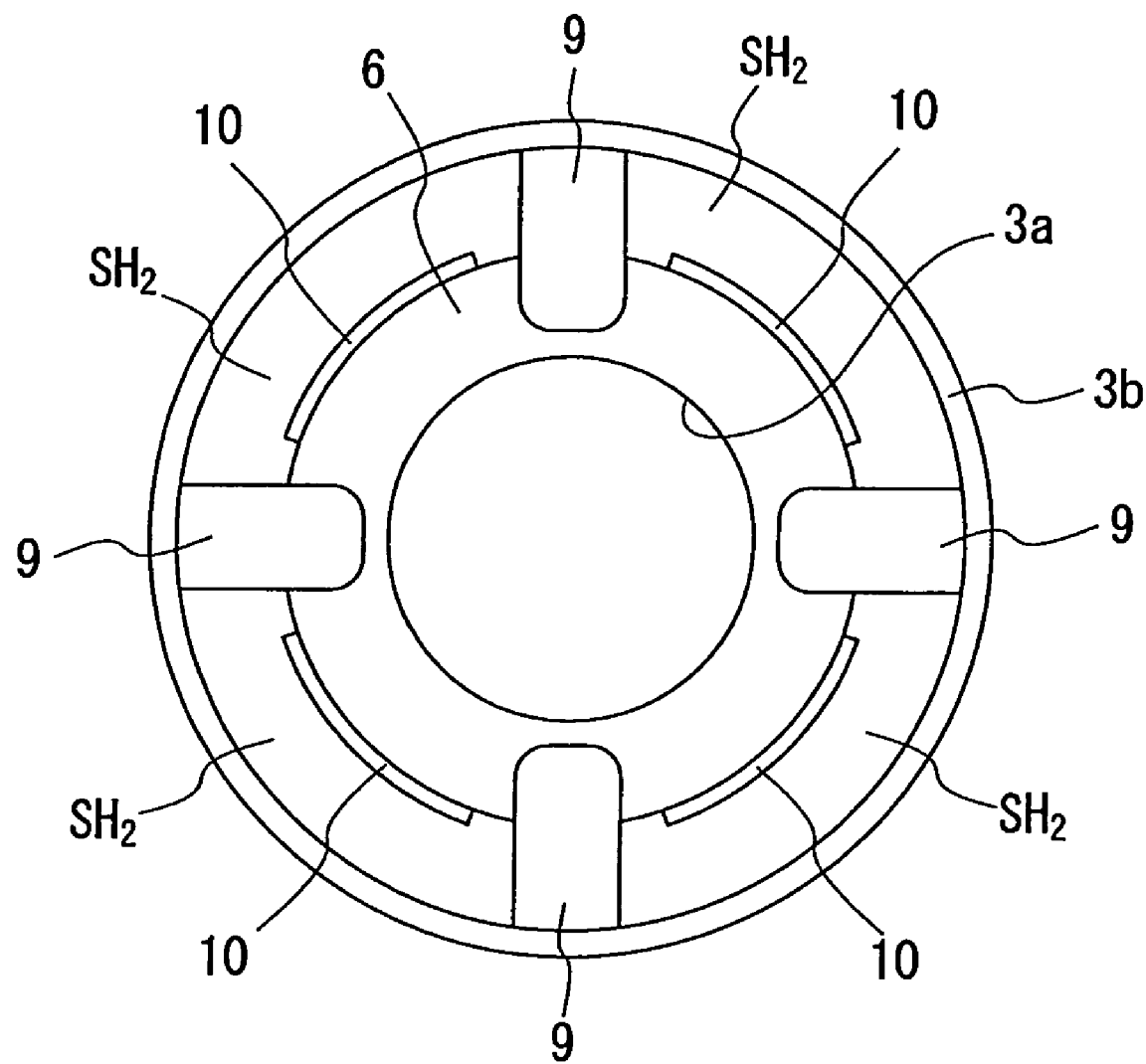
FIG. 4 is a projection view of a major portion of the ventilation member shown in FIG. 1 with respect to an axial direction.

Further, as is shown in the projection view of FIG. 4, the positional relationship between the second openings 5h in the support body 2 and the ventilation hole 3a in the cover part 3 is set in such a manner that all the ventilation membranes 10 are positioned between the ventilation hole 3a formed in the ceiling portion 3c and the inner periphery of the cylindrical side wall portion 3b. When configured in this manner, it is possible to prevent the ventilation membranes 10 from receiving direct impact from the foreign matter in a more reliable manner.

Also, as is shown in FIG. 2, the space $SH_0$ in the interior of the support body 2 has a shape that gradually increases in width as headed toward the second openings 5h from the position of the axial line O. When configured in this manner, it is possible to secure a sufficient length in the axial direction for a tightening portion 8 that tightens the opening part 50a of the casing 50 inserted through the first opening 4h. In other words, it becomes possible to insert the opening part 50a of the casing 50 deeper into the support body 2, which in turn makes it possible to fix the ventilation member 1 to the casing 50 firmly over a long period. In this embodiment, the width of the space $SH_0$ increases continuously as headed toward the second openings 5h from the position of the axial line O. However, the space $SH_0$ may be of a shape that becomes wider step by step.

Also, as is shown in FIG. 3, in the interior of the support body 2, positioning portions 7 (stoppers) are provided for a tip end 50b of the nozzle-shaped opening part 50a to abut thereon and thereby inhibit further forward movement of the nozzle-shaped opening part 50a in the axial direction. The positioning portions 7 are present at angular positions corresponding to the ribs 9. By providing the positioning portions 7 as above, not only is it possible to prevent the space $SH_0$ from being clogged by the nozzle-shaped opening part 50a that is inserted too far inside the support body 2, but it is also possible to define the sufficiently wide clearance AH between the surface 50p of the casing 50 and the lower surface 2p of the support body 2.

As is shown in FIG. 1, the ribs 9 of the support body 2 run around from the upper side of the top portion 6 to the side surface and extend to the lower end of the support body 2 along the axial direction. To be more specific, each rib 9 is formed of a first portion 9a (first spacer) positioned between the ceiling portion 3c of the cover part 3 and the top portion 6 of the support body 2 to define the first clearance $SH_1$ and a second portion 9b (second spacer) positioned between the cylindrical side wall portion 3b of the cover part 3 and the side surface portion 5 of the support body 2 to define the second clearances $SH_2$. As is shown in FIG. 3, the first portion 9a comes into close contact with the ceiling portion 3c of the cover part 3 while it undergoes elastic deformation. Likewise, the second portion 9b comes into close contact with the cylindrical side wall portion 3b of the cover part 3 while it undergoes elastic deformation. By providing these ribs 9a and 9b, not only can the first clearance $SH_1$ and the second clearances $SH_2$ be ensured, but also the support body 2 can be fixed inside the cover part 3. In this embodiment, the ribs 9 are disposed at equiangular intervals of about 90° and the ventilation membranes 10 are positioned between the adjacent ribs 9 and 9. The first ventilation channels $SH_1$ are defined between the adjacent ribs 9 and 9.

The ribs 9 can be formed as separate parts from the support body 2. For example, the ribs 9 can be a part of the cover part 3. Alternatively, of each rib 9, the first portion 9a can be formed integrally with the support body 2 and the second portion 9b can be formed integrally with the cover part 3. It is possible to achieve the same effect as in this embodiment by adopting any of these configurations.

Second Embodiment

Figure 5:
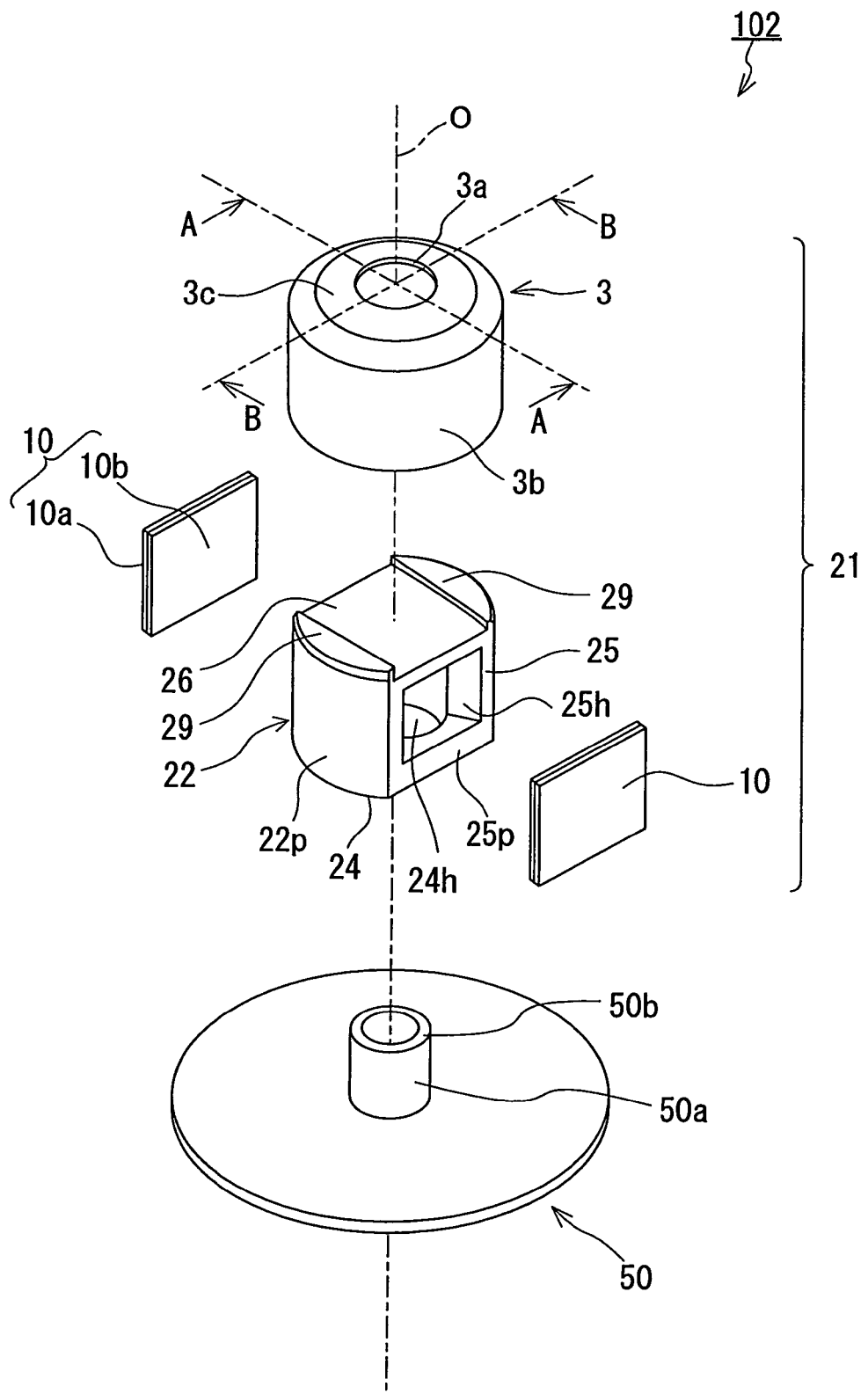
FIG. 5 is an exploded perspective view of a ventilation member according to a second embodiment of the invention.
Figure 6:
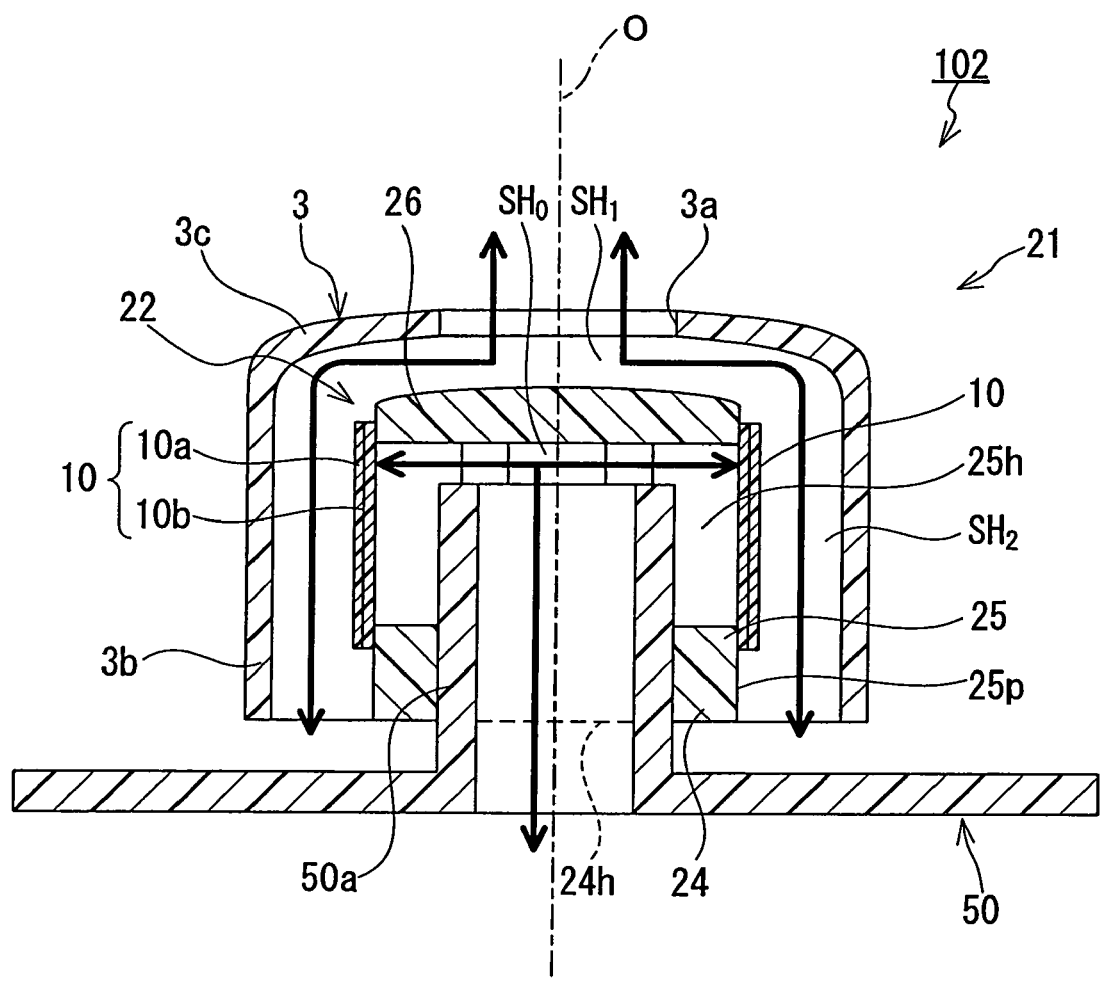
FIG. 6 is a cross section taken on line A-A showing the ventilation member shown in FIG. 5 in an assembled state.
Figure 7:
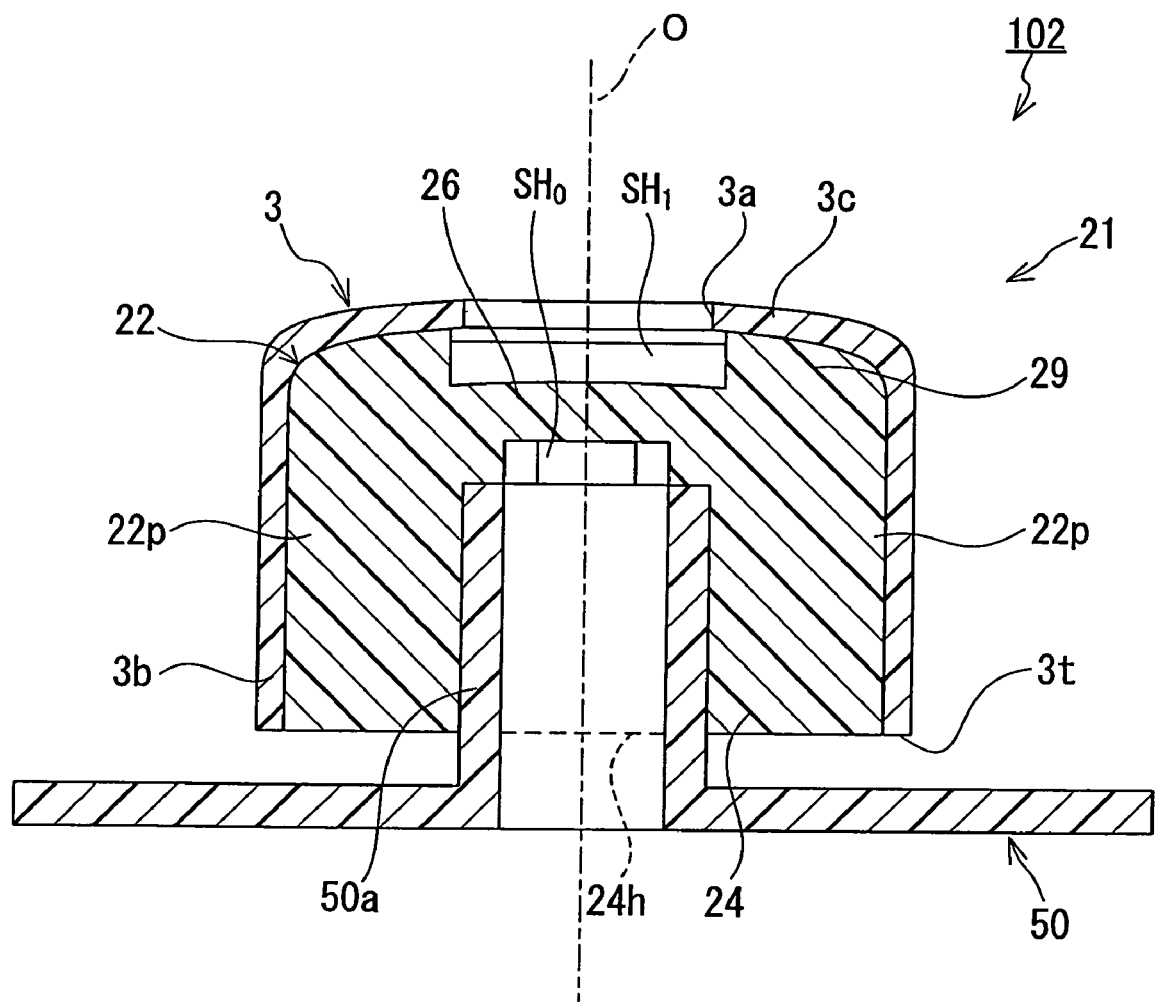
FIG. 7 is a cross section taken on line B-B showing the ventilation member shown in FIG. 5 in the assembled state.

FIG. 5 is an exploded perspective view of a ventilation member of a second embodiment. FIG. 6 is a cross section taken on line A-A of FIG. 5 and FIG. 7 is a cross section taken on line B-B of FIG. 5. As is shown in FIG. 5, a ventilation member 21 includes a support body 22, ventilation membranes 10, and a cover part 3, and forms a ventilation structure 102 when installed on the opening part 50a of the casing 50 to enable ventilation between the interior and the exterior of the casing 50. The ventilation membranes 10 and the cover part 3 are common with those in the first embodiment above. A major difference is the structure of the support body 22.

As are shown in FIG. 5 through FIG. 7, the support body 22 of the ventilation member 21 is of a configuration in the shape of a column, and includes a bottom surface portion 24 to be connected to the casing 50, a side surface portion 25 on which the ventilation membranes 10 are installed, a top portion 26 positioned on the side opposite to the bottom surface portion 24, and ribs 29 that define a clearance $SH_1$ between the support body 22 and the cover part 3. It is common with the first embodiment above that a first opening 24h is formed in the bottom surface portion 4, the side opposite to the bottom surface 24 is the top portion 26 of a dome shape that is slightly curved convexly toward the ventilation hole 3a in the cover part 3, second openings 25h are formed in the side surface portion 25, the space $SH_0$ in the interior of the support body 22 communicates with the first opening 24h and the second openings 25h, and so forth.

In this embodiment, the second openings 25h are formed at two points at an interval of 180°. The opening peripheral surface 25p of the side surface portion 25 is a flat surface parallel to the axial direction. With this configuration, it is possible to maintain the entire principal surfaces (the surface having the largest area) of each ventilation membrane 10 almost parallel to the axial direction. When configured in this manner, it becomes easier to install the ventilation membranes 10 on the support body 22.

As is shown in FIG. 6, the second openings 25h and 25h formed in the support body 22 at two points are symmetrical with respect to the axial line O. Also, as is shown in the projection view of FIG. 8, clearances $SH_2$ defined between the cylindrical side wall portion 3b of the cover part 3 and the ventilation membranes 10 have crescent-shaped cross sections perpendicular to the axial direction. As is shown in FIG. 7, the support body 22 is fixed as the side surface portion 22p having a cylindrical surface comes into close contact with the cylindrical side wall portion 3b of the cover part 3. When configured in this manner, it is possible to fix the support body 22 inside the cover part 3 without having to provide ribs on the side surface. In addition, the ribs 29 that come into close contact with the ceiling portion 3c of the cover part 3 are formed at positions up to which segments of the side surface portion 22p having no second openings 25h are extended to the upper side with respect to the axial direction. The ribs 29 come into contact with the ceiling portion 3c of the cover part 3 and the clearance $SH_1$ thus is defined between the top portion 26 and the ceiling portion 3c.

Figure 8:
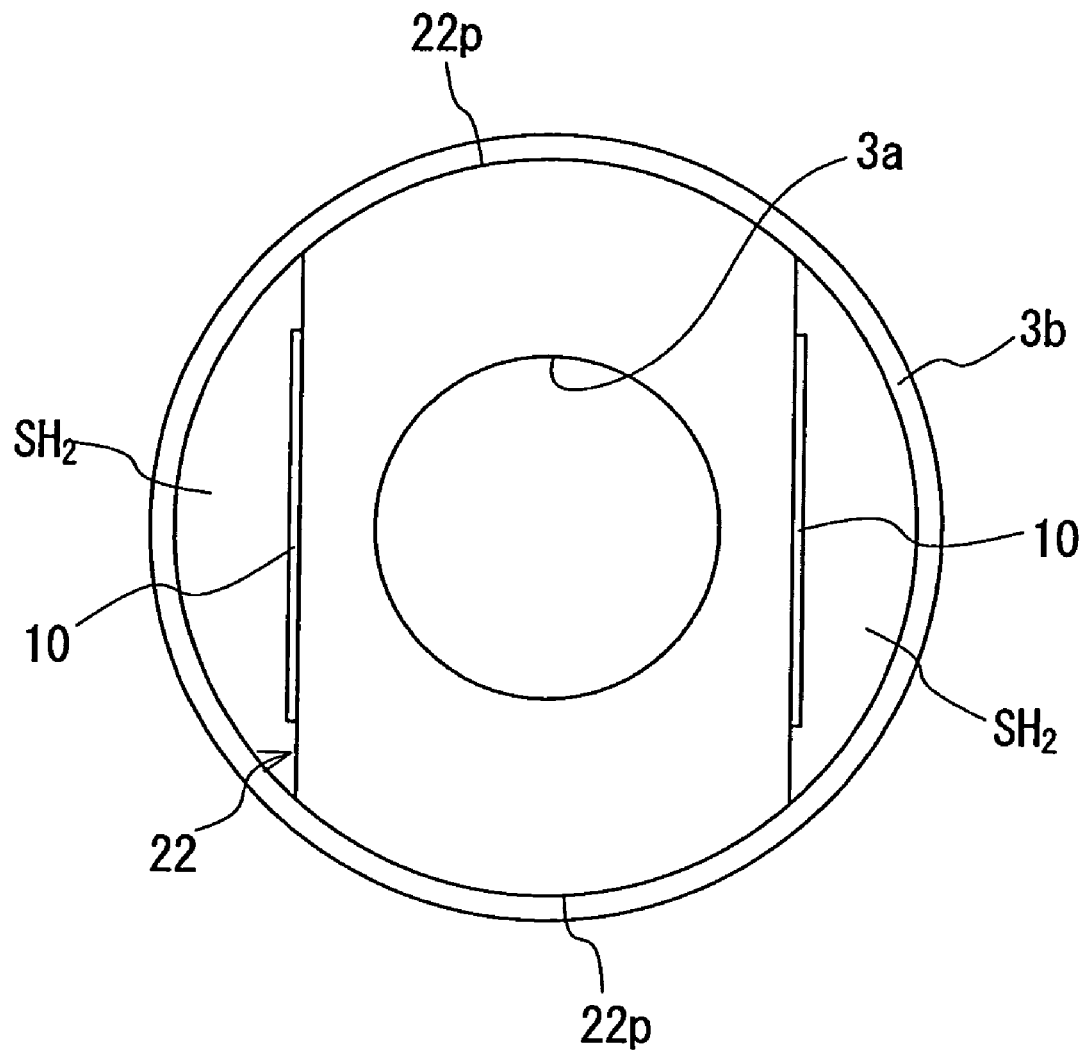
FIG. 8 is a projection view of a major portion of the ventilation member shown in FIG. 5 with respect to the axial direction.

Also, as can be understood from the projection view of FIG. 8, the ventilation hole 3a in the cover part 3 fits in on the inner side of the top portion 26 of the support body 22. In addition, the two ventilation membranes 10 are positioned between the cylindrical side wall portion 3b and the ventilation hole 3a of the cover part 3. These points are also common with the first embodiment above.

Figure 9:
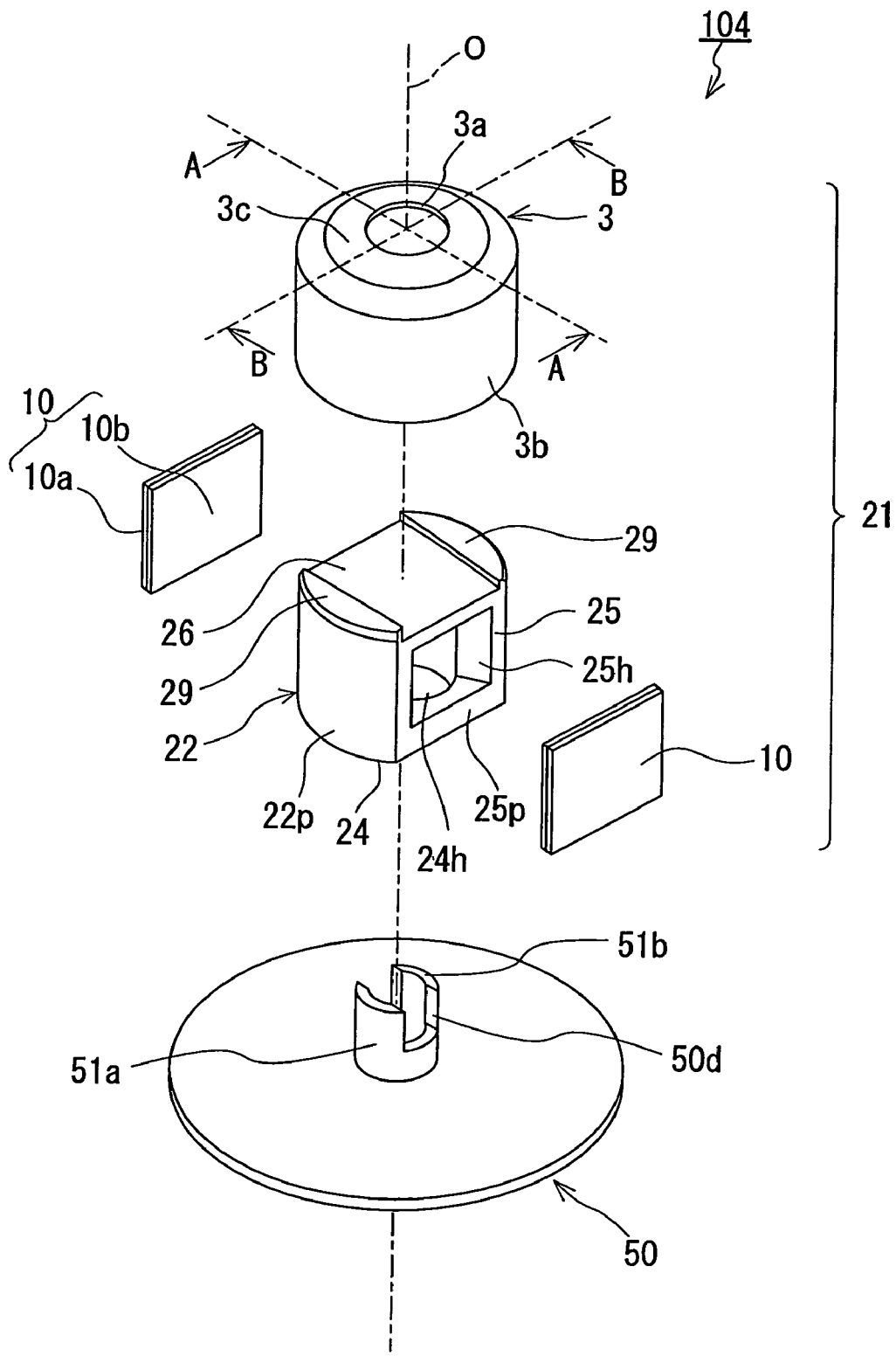
FIG. 9 is an exploded perspective view of another ventilation structure using the ventilation member of the second embodiment.
Figure 10:
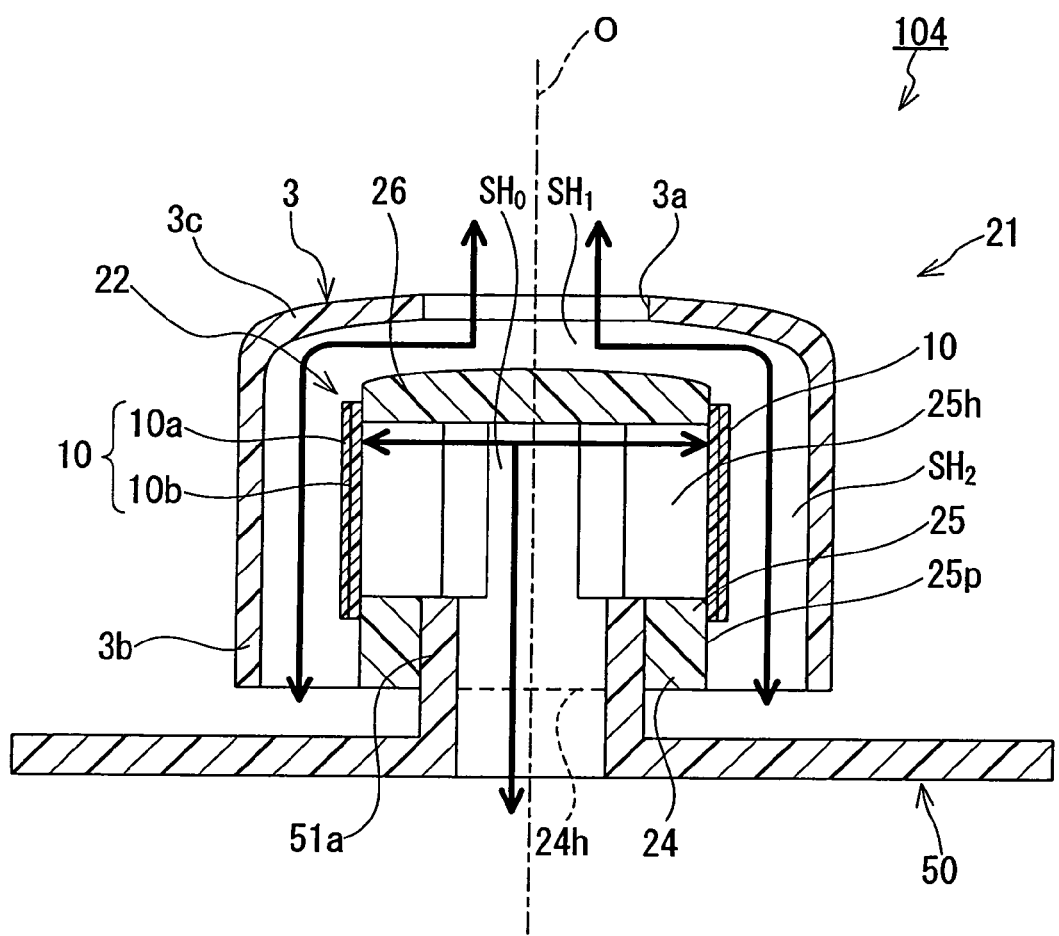
FIG. 10 is a cross section taken on line A-A showing the ventilation structure shown in FIG. 9.
Figure 11:
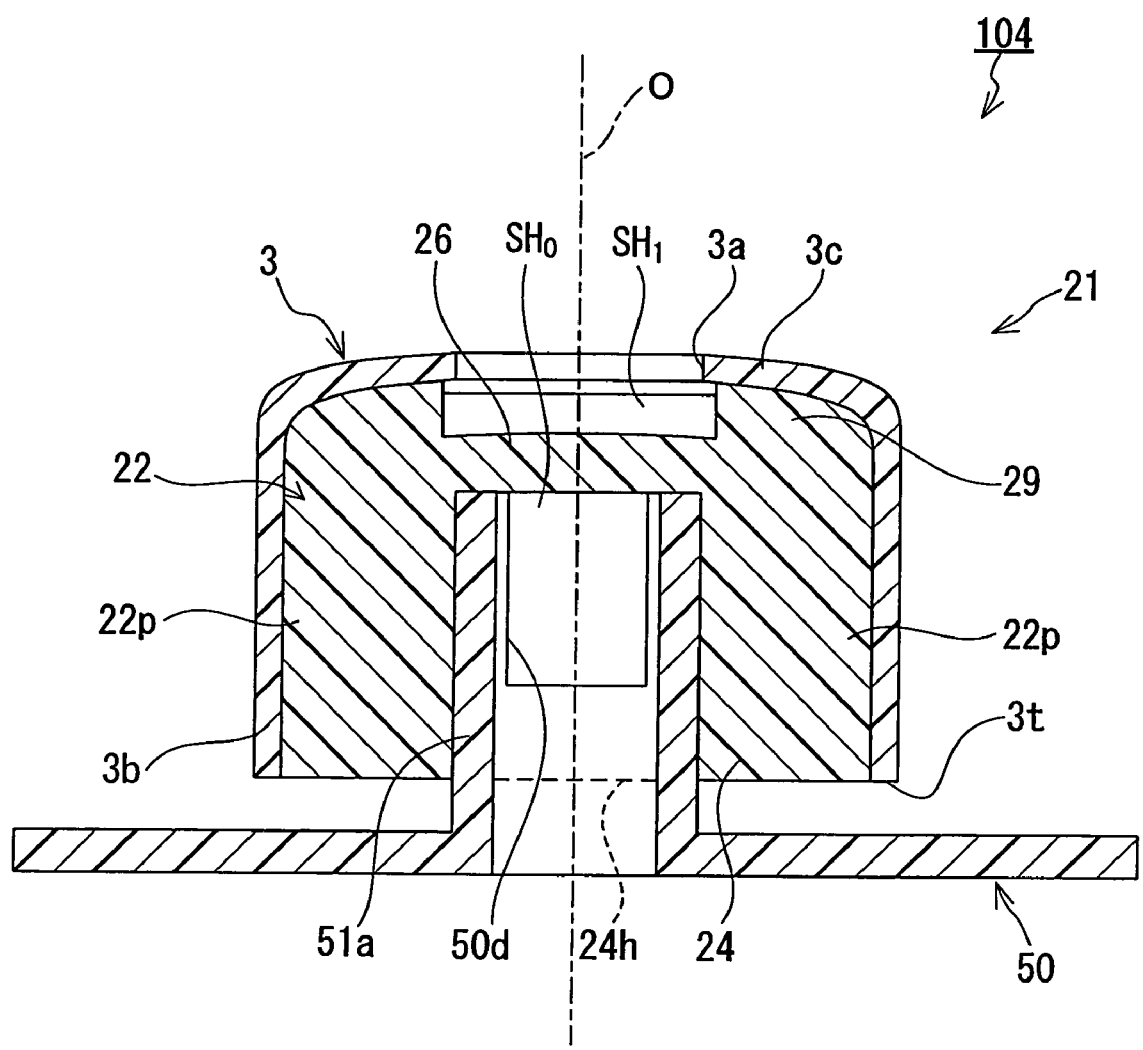
FIG. 11 is a cross section taken on line B-B showing the ventilation structure shown in FIG. 9.

Another Example of Ventilation Structure Using Ventilation Member of Second Embodiment FIG. 9 is an exploded perspective view of another ventilation structure using the ventilation member 21 of the second embodiment. FIG. 10 and FIG. 11 are cross sections of the ventilation structure shown in FIG. 9. A ventilation structure 104 shown in FIG. 9 through FIG. 11 is different from the ventilation structure of the second embodiment above in the shape of the opening part of the casing.

As is shown in FIG. 9, in this embodiment, notches 50d are formed in an opening part 51a of the casing 50. Each notch 50d is of a shape made by cutting out a part of the nozzle-shaped opening part 51a from the tip end 51b side toward the opposite side (the base end side). The angle of installment of the ventilation member 21 on the casing 50 is adjusted so that the positions at which the notches 50d are formed and the positions at which the second holes 25h in the support body 22 are formed overlap (preferably, coincide with each other). According to such notches 50d, as is shown in the cross section of FIG. 10, air circulates smoothly in a direction perpendicular to the axial direction at the angular positions where the second openings 25h are formed. On the other hand, as is shown in the cross section of FIG. 11, at the angular positions where no second openings 25h are formed, a tightening force from the side surface portion 22p acts on the opening part 51a at the entire part inserted inside the support body 22. It is thus possible to fix the support body 22 firmly to the opening part 51a of the casing 50. As has been described, in a case where the ventilation membranes 10 are disposed at the side surface of the support body 22, it is suitable to form the notches 50d in the opening part 51a of the casing 50.

In addition, by forming the notches 50d in the opening part 51a of the casing 50 first and then adjusting the angular positions between the notches 50d and the second openings 25h appropriately, there will arise no problem of the space $SH_0$ being clogged by the opening part 51a of the casing 50 that is inserted too far inside the support body 22. Accordingly, it is no longer necessary to provide stoppers used for the positioning with respect to the opening part 51a of the casing 50 in the interior of the support body 22. It is preferable that, as is shown in FIG. 9, the number of the notches 50d is equal to the number of the second openings 25 formed in the support body 22 of the ventilation member 21. Alternatively, by providing a ventilation hole penetrating through the side surface of the nozzle-shaped opening part 51a instead of the notches 50d or in addition to the notches 50d, it is also possible to achieve the same effect as described above.

As has been described, according to the invention, it is possible to provide a compact ventilation member with which satisfactory permeability is maintained and in which foreign matter, such as water droplets, hardly remains inside the cover part regardless of the posture in which the ventilation member 1 or 21 is used.

INDUSTRIAL APPLICABILITY

The ventilation members of the invention are suitable for the casings of electric components for automobile, such as head lamps, rear lamps, fog lamps, turn lamps, back lamps, motor cases, pressure sensors, pressure switches, and ECUs. It is possible to achieve significant advantages by installing the ventilation members of the invention on the casings of electric components for automobile, in particular, lamps and ECUs that are exposed directly to the weather and undergo streams of water during car washing. Also, besides the electric components for automobile, the ventilation members of the invention can be installed suitably on casings of electric appliances, such as mobile communication devices, cameras, electric shavers, and electric toothbrushes.

The invention claimed is:

1. A ventilation member to be installed on a casing that needs ventilation, comprising:
   a support body provided with a space in an interior thereof, the space serving as a ventilation channel between an interior and an exterior of the casing, the support body having a bottom surface portion in which a first opening is formed, a top portion positioned on a side opposite to the bottom surface portion and a side surface portion in which a second opening is formed, the first and second openings bringing the space into communication with the exterior, and the support body being configured in such a manner that the bottom surface portion in which the first opening is formed serves as a connection portion to be connected to the casing;
   a ventilation membrane installed on the side surface portion of the support body so as to close the second opening; and
   a cover part inside of which the support body is fit in from a side opposite to the bottom surface portion,
   wherein, assuming a direction in which the support body is to be fit in inside the cover part to be an axial direction, then in an assembled state where the support body is fit in inside the cover part:
   the cover part has a cylindrical side wall portion that surrounds the support body in a circumferential direction and a ceiling portion that continues to one end side of the cylindrical side wall portion and covers the support body from the side opposite to the bottom surface portion;
   a length of the cylindrical side wall portion with respect to the axial direction is adjusted so that the ventilation membrane is protected in such a state where the membrane faces the cylindrical side wall portion; and
   a first clearance that functions as the ventilation channel is defined between the ceiling portion of the cover part and the top portion of the support body and a second clearance that communicates with the first clearance is defined between the cylindrical side wall portion of the cover part and the ventilation membrane in such a manner that the second clearance communicates with the exterior from a side opposite to the side where the ceiling portion of the cover part is positioned.

2. The ventilation member according to claim 1, wherein: the second opening is formed in the side surface portion of the support body so that a thickness direction of the ventilation membrane becomes almost perpendicular to the axial direction.

3. The ventilation member according to claim 1, wherein: a ventilation hole is formed in the ceiling portion of the cover part, and
   the first clearance and the second clearance communicate with the exterior of the cover part also through the ventilation hole.

4. The ventilation member according to claim 3, wherein: the support body has a configuration that is hollow and in a shape of a column, and configured in such a manner that the bottom surface portion in which the first opening is formed is positioned on one end side with respect to the axial direction, a portion on the side opposite to the bottom surface portion forms a top portion that faces the ventilation hole in the cover part, and the ventilation hole fits entirely within an outer periphery of the top portion when viewed in a projection view with respect to the axial direction.

5. The ventilation member according to claim 3, wherein: a positional relationship between the second opening and the ventilation hole is set so that the ventilation membrane is positioned entirely between the ventilation hole formed in the ceiling portion and an inner periphery of the cylindrical side wall portion when viewed in a projection view with respect to the axial direction.

6. The ventilation member according to claim 1, wherein: the support body has a configuration that is hollow and in a shape of a column, and is configured in such a manner that the bottom surface portion in which the first opening is formed is positioned on one end side with respect to the axial direction, the second opening is formed at more than one point along a circumferential direction of the side surface portion positioned in a segment from the bottom surface portion to a portion on the side opposite to the bottom surface portion, and the ventilation membrane in a plural form is installed on the side wall portion so as close the more than one second opening individually.

7. The ventilation member according to claim 1, wherein: the support body is of a configuration in a shape of a circular column as a whole and configured in such a manner that an opening peripheral surface of the side surface portion to which the ventilation membrane is disposed is a curved surface that conforms to a contour of the support body in the shape of the circular column.

8. The ventilation member according to claim 1, wherein: an opening peripheral surface of the side surface portion to which the ventilation membrane is disposed is a flat surface capable of maintaining an entire principal surface of the ventilation membrane almost parallel to the axial direction.

9. The ventilation member according to claim 1, further comprising:
   a first spacer that is positioned between the ceiling portion of the cover part and the support body and defines the first clearance when brought in the assembled state.

10. The ventilation member according to claim 9, wherein: the first spacer is formed integrally with at least one of the cover part and the support body.

11. The ventilation member according to claim 1, further comprising:
    a second spacer that is positioned between the cylindrical side wall portion of the cover part and the support body and defines the second clearance when brought in the assembled state.

12. The ventilation member according to claim 11, wherein:
    the second spacer is formed integrally with at least one of the cover part and the support body.

13. The ventilation member according to claim 1, further comprising:
    a first spacer that is positioned between the ceiling portion of the cover part and the support body and defines the first clearance when brought in the assembled state; and a second spacer that is positioned between the cylindrical side wall portion of the cover part and the support body and defines the second clearance when brought in the assembled state, wherein one or both of the first spacer and the second spacer are formed integrally with the cover part or the support body.

14. The ventilation member according to claim 1, wherein: the support body is made of thermoplastic elastomer.

15. A ventilation structure, comprising:

a casing having an opening part of a convex shape protruding outward; and a ventilation member installed on the opening part, wherein the ventilation member is the ventilation member set forth in claim 1.

16. The ventilation structure according to claim 15, wherein:

a notch or a ventilation hole is formed in the opening part, and the ventilation member is installed on the opening part of the casing so that a position at which the notch or the ventilation is formed and a position at which the second opening is formed overlap.

17. A ventilation member to be installed on a casing that needs ventilation, comprising:

a support body provided with a space in an interior thereof, the space serving as a ventilation channel between an interior and an exterior of the casing, the support body having a bottom surface portion in which a first opening is formed and a side surface portion in which a second opening is formed, the first and second openings bringing the space into communication with the exterior, and the support body being configured in such a manner that the bottom surface portion in which the first opening is formed serves as a connection portion to be connected to the casing;

a ventilation membrane installed on the side surface portion of the support body so as to close the second opening; and a cover part inside of which the support body is fit in from a side opposite to the bottom surface portion, wherein, assuming a direction in which the support body is to be fit in inside the cover part to be an axial direction, then in an assembled state where the support body is fit in inside the cover part:

the cover part has a cylindrical side wall portion that surrounds the support body in a circumferential direction and a ceiling portion that continues to one end side of the cylindrical side wall portion and covers the support body from the side opposite to the bottom surface portion;

a length of the cylindrical side wall portion with respect to the axial direction is adjusted so that the ventilation membrane is protected in such a state where the membrane faces the cylindrical side wall portion;

a first clearance that functions as the ventilation channel is defined between the ceiling portion of the cover part and the support body and a second clearance that communicates with the first clearance is defined between the cylindrical side wall portion of the cover part and the ventilation membrane in such a manner that the second clearance communicates with the exterior from a side opposite to the side where the ceiling portion of the cover part is positioned; and a ventilation hole is formed in the ceiling portion of the cover part, and the first clearance and the second clearance communicate with the exterior of the cover part also through the ventilation hole.

18. A ventilation member to be installed on a casing that needs ventilation, comprising:

a support body provided with a space in an interior thereof, the space serving as a ventilation channel between an interior and an exterior of the casing, the support body having a bottom surface portion in which a first opening is formed and a side surface portion in which a second opening is formed, the first and second openings bringing the space into communication with the exterior, and the support body being configured in such a manner that the bottom surface portion in which the first opening is formed serves as a connection portion to be connected to the casing;

a ventilation membrane installed on the side surface portion of the support body so as to close the second opening; and a cover part inside of which the support body is fit in from a side opposite to the bottom surface portion, wherein, assuming a direction in which the support body is to be fit in inside the cover part to be an axial direction, then in an assembled state where the support body is fit in inside the cover part:

the cover part has a cylindrical side wall portion that surrounds the support body in a circumferential direction and a ceiling portion that continues to one end side of the cylindrical side wall portion and covers the support body from the side opposite to the bottom surface portion;

a length of the cylindrical side wall portion with respect to the axial direction is adjusted so that the ventilation membrane is protected in such a state where the membrane faces the cylindrical side wall portion;

a first clearance that functions as the ventilation channel is defined between the ceiling portion of the cover part and the support body and a second clearance that communicates with the first clearance is defined between the cylindrical side wall portion of the cover part and the ventilation membrane in such a manner that the second clearance communicates with the exterior from a side opposite to the side where the ceiling portion of the cover part is positioned; and the support body has a configuration that is hollow and in a shape of a column, and is configured in such a manner that the bottom surface portion in which the first opening is formed is positioned on one end side with respect to the axial direction, the second opening is formed at more than one point along a circumferential direction of the side surface portion positioned in a segment from the bottom surface portion to a portion on the side opposite to the bottom surface portion, and the ventilation membrane in a plural form is installed on the side wall portion so as to close the more than one second opening individually.

* * * * *